United States Patent
Chung

(10) Patent No.: US 6,301,174 B1
(45) Date of Patent: Oct. 9, 2001

(54) POWER CONSERVATION DURING MEMORY READ OPERATIONS

(75) Inventor: Chih-Hung Chung, Saratoga, CA (US)

(73) Assignee: Intel Corporation, Santa Clara, CA (US)

(*) Notice: Subject to any disclaimer, the term of this patent is extended or adjusted under 35 U.S.C. 154(b) by 0 days.

(21) Appl. No.: 09/470,679

(22) Filed: Dec. 23, 1999

(51) Int. Cl.[7] .................................................. G11C 7/00
(52) U.S. Cl. ................................... 365/203; 365/154
(58) Field of Search ........................ 365/230.05, 203, 365/154, 129, 189.01, 230.01

(56) References Cited

U.S. PATENT DOCUMENTS

| | | | |
|---|---|---|---|
| 5,493,536 | * 2/1996 | Aoki | 365/230.05 |
| 5,754,485 | * 5/1998 | Miura | 365/203 |
| 5,870,331 | * 2/1999 | Hwang et al. | 365/154 |
| 6,078,544 | * 6/2000 | Park | 365/230.05 |
| 6,091,629 | * 7/2000 | Osada et al. | 365/156 |
| 6,097,651 | * 8/2000 | Chan et al. | 365/203 |

\* cited by examiner

*Primary Examiner*—Hoai V. Ho
(74) *Attorney, Agent, or Firm*—Kenyon & Kenyon

(57) ABSTRACT

In accordance with an embodiment of the invention, unused data bits are set to a preferred value, either zero or one, depending on the circuit used to read the data. With the unused data bits set to the preferred value the precharge is not discharged during the data read operation. Not discharging the precharge allows power to be saved in the subsequent precharge and read operation.

23 Claims, 4 Drawing Sheets

POWER CONSERVATION DURING MEMORY READ OPERATIONS

FIELD OF THE INVENTION

The present invention relates to reading from computer memory. More particularly, the present invention relates to conserving power during memory read operations.

BACKGROUND OF THE INVENTION

A common operation in computer processing is reading a data value from memory, such as a random access memory (RAM). A single RAM cell typically holds the value of a single data bit, a zero or a one. Most memory chips arrange the RAM cells in arrays of $2^n$ by $2^m$ bits. The $2^n$ rows may be efficiently accessed an entire row at one time, and a column decoder then selects one word of $2^k$ bits out of $2^m$ in the row, to read, corresponding to $2^k$ individual RAM cells. An entire word is typically retrieved from RAM and some systems may read each of the word bits instead of selectively reading only a few bits. Since in many instances each bit in the word will be needed, it is often more efficient to read the entire row than to incur the overhead of specifying individual bits and only reading those specified. However, there may be instances when not every bit in a particular word is needed.

Although there are many possible circuit designs for an individual RAM cell, and the present invention is not intended to be limited to any particular RAM design, a common technique for reading a value from RAM is to first precharge a bit line and then to sense, or read the RAM value. The precharge operation typically involves "pulling up" one or more bit lines to a voltage level corresponding to a logical "one". Following the precharge, one or more access transistors may allow the bit line(s) to interact with the RAM cell. The precharged bit line may then be conditionally discharged based on the data value stored in the RAM cell. Thus, the interaction of the precharged bit line(s) and the RAM value may be used to read the RAM value.

Whether the precharge discharges on a zero or a one stored in a RAM cell depends on the circuit used, and the present invention is not intended to be limited to any particular RAM read circuit. However, for one of the two data states, the precharge is discharged. As will be explained more fully below, there are situations where it may be advantageous to avoid discharging the precharge so that subsequent read operations do not have to pull up, or charge, the bit line. The present invention avoids discharging the precharge in these instances, and in doing so conserves the power needed to fully precharge the bit line on subsequent read operations.

SUMMARY OF THE INVENTION

In accordance with an embodiment of the invention, unused data bits are set to a preferred value, either zero or one, depending on the circuit used to read the data. With the unused data bits set to the preferred value the precharge is not discharged during the data read operation. Not discharging the precharge allows power to be saved in the precharge and read operation.

DETAILED DESCRIPTION

Figure 1:
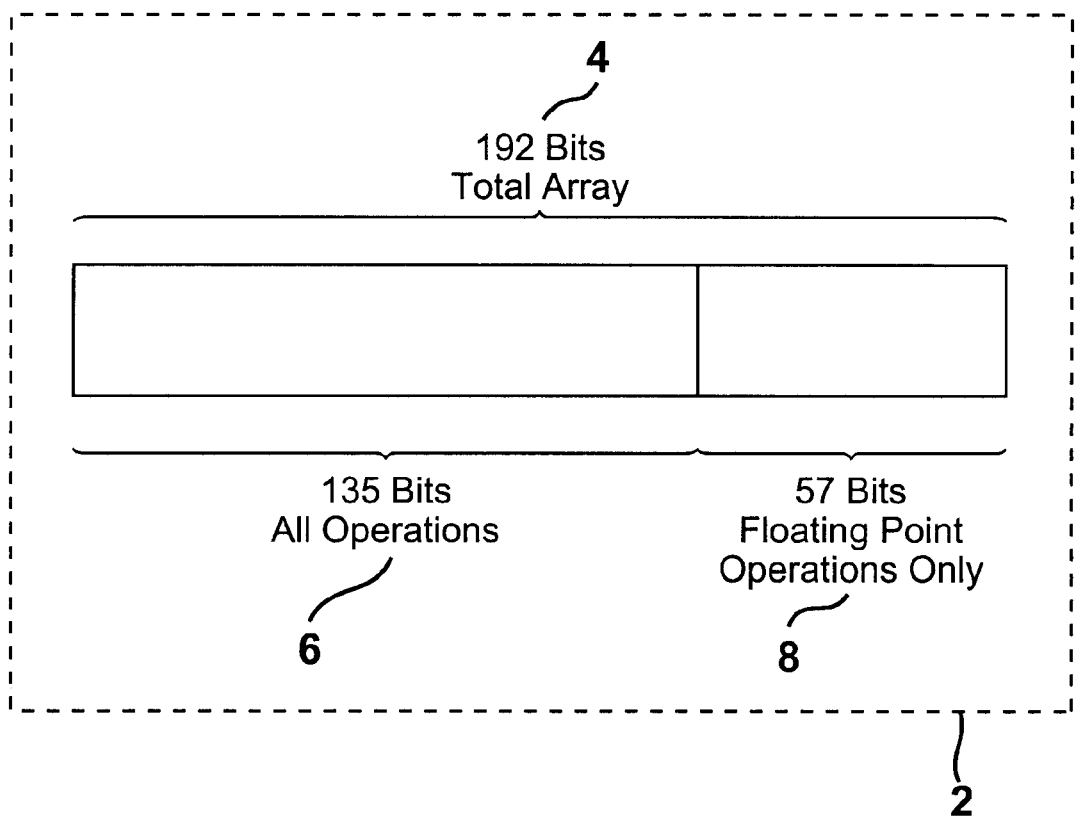
FIG. 1 is a representation of a data array operated on by an embodiment of the present invention.

An embodiment is directed a method of conserving power while reading data stored in a random access memory (RAM), and an apparatus for carrying out the method. The power is conserved by selectively storing a preferred value in RAM, in certain situations, and avoiding the discharge of a precharge voltage from one or more bit lines. The avoidance of the precharge discharging during a read operation eliminates the need to completely precharge, or pull up, the bit line to a voltage corresponding to a one on the subsequent read operation. In this way, an embodiment of the present invention conserves power.

There are instances where not all of the bits in a data array are used. For example, a large array used to specify micro-operations may be comprised of a first group of bits that are always used and a second group of bits that are only used for floating point micro-operations. The data represented by the second group, the floating point specific bit fields, are of no interest when integer micro-operations are stored in the array. That is, these floating point specific bit fields may be unused during integer micro-operations. However, the memory reading system may not be configured to avoid reading the unused fields. More importantly, reading the unused fields may waste power by precharging the bit lines and then conditionally discharging that precharge in order to read the data values. The present invention sets a preferred value in the unused bit fields so that the precharge voltage is not discharged during the read process, saving the precharge for subsequent read operations.

An embodiment of the present invention is used with a 192 bit array, where 57 of those bits are floating point specific, and are not used for integer operations. Such an array 2 is shown as FIG. 1, and corresponds to a format that may be used for a Free List Manager (FLM) array in some CPU micro architectures. The total array 4 is composed of a 135 bit portion 6, used for all operations, and a 57 bit portion 8 that is only used for floating point operations. If half of the unused bits are zeros and the other half are ones, and ignoring the power required to initially set the unused bits to a preferred value, a power savings of approximately 15% may be achieved with this embodiment of the present invention. For a processor operating at a 900 MHz clock speed and 1.3 V, the power saving may be about 15 mW.

Although large arrays used to store micro-operation codes, such as the array shown in FIG. 1, are prime candidates for an embodiment of the present invention, the present invention is not intended to be limited to any particular data format. Rather, any array containing bits that will be read, with the actual values ignored, are suitable for use with an embodiment of the present invention. A Reservation Station (RS) data array is another example of such an array.

An embodiment of the present invention may be considered as comprising two interrelated elements. The first identifies unused bit fields in selected micro-operations and sets these bit fields to a preferred value. The second reads the preferred value in the bit fields in such a way that the precharge is saved. Whether the preferred bit value is a logical one or zero depends on circuit used to read the bit. An embodiment of the bit reading circuit will be discussed first.

Figure 2:
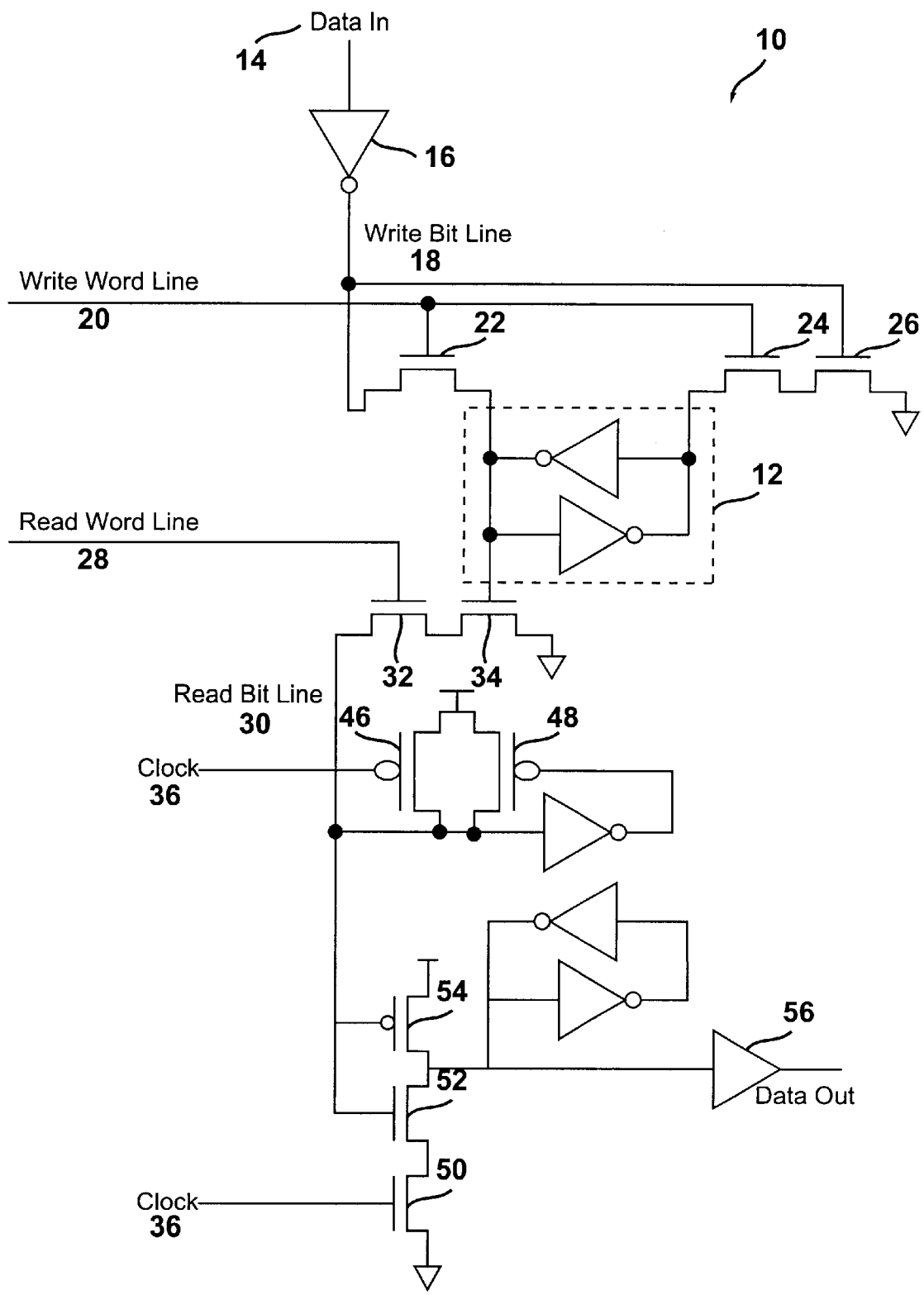
FIG. 2 is a schematic representation of an embodiment of the present invention.

A schematic of an embodiment of the present invention is shown in FIG. 2. Circuit 10 is one of many possible circuit designs and the present invention is not intended to be limited to any particular circuit layout. RAM 12 stores a single data value, and is typically part of a larger ($2^n \times 2^m$) memory array. RAM 12 may hold a non-zero voltage $V_{DD}$, representing a one, or be set to ground, representing a zero.

The value stored in RAM 12 may be set by the data in 14 path, passing through inverter 16, via write bit line 18. Write word line 20 is asserted to allow data to pass through access transistors 22 and 24. The value on write bit line 18 conditionally allows signal passage through transistor 26, connected to ground. Read word line 28 is asserted to conditionally ground read bit line 30, through transistor 32, when a one is stored in RAM 12 allowing a path through transistor 34.

Figure 3:
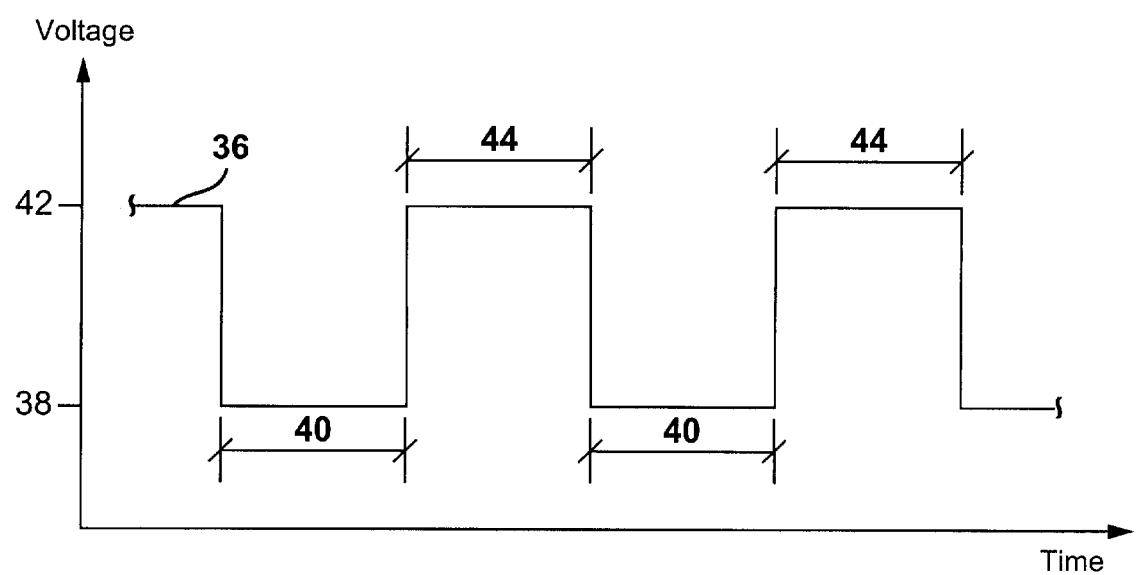
FIG. 3 illustrates a typical idealized clock signal.

FIG. 3 illustrates an idealized clock signal 36 used to coordinate the timing of circuit 10. Clock signal 36 alternates between a low state 38 (which may equal a ground) during time periods 40, and a high state 42 (which may equal $V_{DD}$) during time periods 44. An embodiment of the present invention uses such a clock signal to both precharge read bit line 30, during low state 38, and read (or latch) RAM 12, during high state 44. Those of ordinary skill in the art will recognize that two separate clock signals could be used to precharge and read, however, such separate clock signals may have to be synchronized. A single precharge and read clock avoids the need to synchronize the separate clock signals.

When clock signal 36 goes low 38, transistors 46 and 48 allow $V_{DD}$ to precharge bit line 30. That is, the voltage in bit line 30 is pulled up to $V_{DD}$ as a current passes through transistors 46 and 48. When clock signal 36 goes high 42, transistors 46 and 48 open the circuit between read bit line 30 and $V_{DD}$, stopping the precharge process. A high 42 clock signal 36 may also assert read word line 28, on transistor 32, and latch clock 36, on transistor 50. Whether or not the precharge voltage $V_{DD}$ discharges to ground depends on the value in RAM 12. If a one is stored in RAM 12, while read word line 28 is asserted, the precharge passes through transistors 32 and 34 to ground. If instead, RAM 12 is storing a zero, then $V_{DD}$ will not pass transistor 34, and the precharge is conserved. That is, during the next half clock cycle, bit line 30 may not need to be precharged, because it is already at or near $V_{DD}$. If a one is stored in RAM 12, the voltage in read bit line 30 goes to ground, and the precharge will need to be restored back to $V_{DD}$ before the next read operation.

The voltage in read bit line 30, which is low if the precharge discharged because of a one stored in RAM 12 or high because of a zero in RAM 12, determines the value of data out 56. That is, a low bit line 30 allows $V_{DD}$ to pass through transistor 54, creating a one as the data out 56 value. If read bit line 30 did not discharge, transistors 50 and 52 allow a zero to be output to data out 56. Note that the value of data out 56 matches the value of the data stored in RAM 12.

The precharge voltage in circuit 10 will not discharge to ground when a zero is stored in RAM 12. For that reason, a zero is the preferred value in RAM 12 for unused bit fields in circuit 10. Therefore, a one at data 14, which will be inverted by inverter 16, will be used to set the RAM 12 value.

Other embodiments of the present invention may have opposite preferred values for the data in RAM 12 or set at data in 14. The present invention conserves the precharge, by preventing the precharge from escaping to ground, for unused bit fields. The present invention is not, however, intended to be limited to any particular circuit design. Preferably, CMOS is used for circuit 10, although the present invention is not intended to be limited to any particular circuit design. Those of ordinary skill in the art, with the benefit of this disclosure, will recognize that circuit 10 is only one of many that may be used with the present invention.

An embodiment of the present invention, such as circuit 10 shown in FIG. 2, uses a single read bit line 30. Some prior art RAM read systems use dual bit lines, where one of the bit lines will always go to a low voltage when the RAM data is read. Such dual bit line systems typically use the difference in the two bit line voltage values to determine the value of the RAM data. Unlike the present invention, there is no preferred value to store in RAM for such dual bit line systems that will prevent to conserve the precharge.

Write word line 20 and read word line 28 are shown using a single bit values in FIG. 2, while typically word lines 20 and 28 are connected to row and column decoders. The schematic of FIG. 2 was simplified because the circuit may be easily adapted to a wide variety of memory arrays. The details of the memory array access is not particularly important to the implementation of the present invention, and the present invention is not intended to be limited to any particular memory array access protocol.

Figure 4:
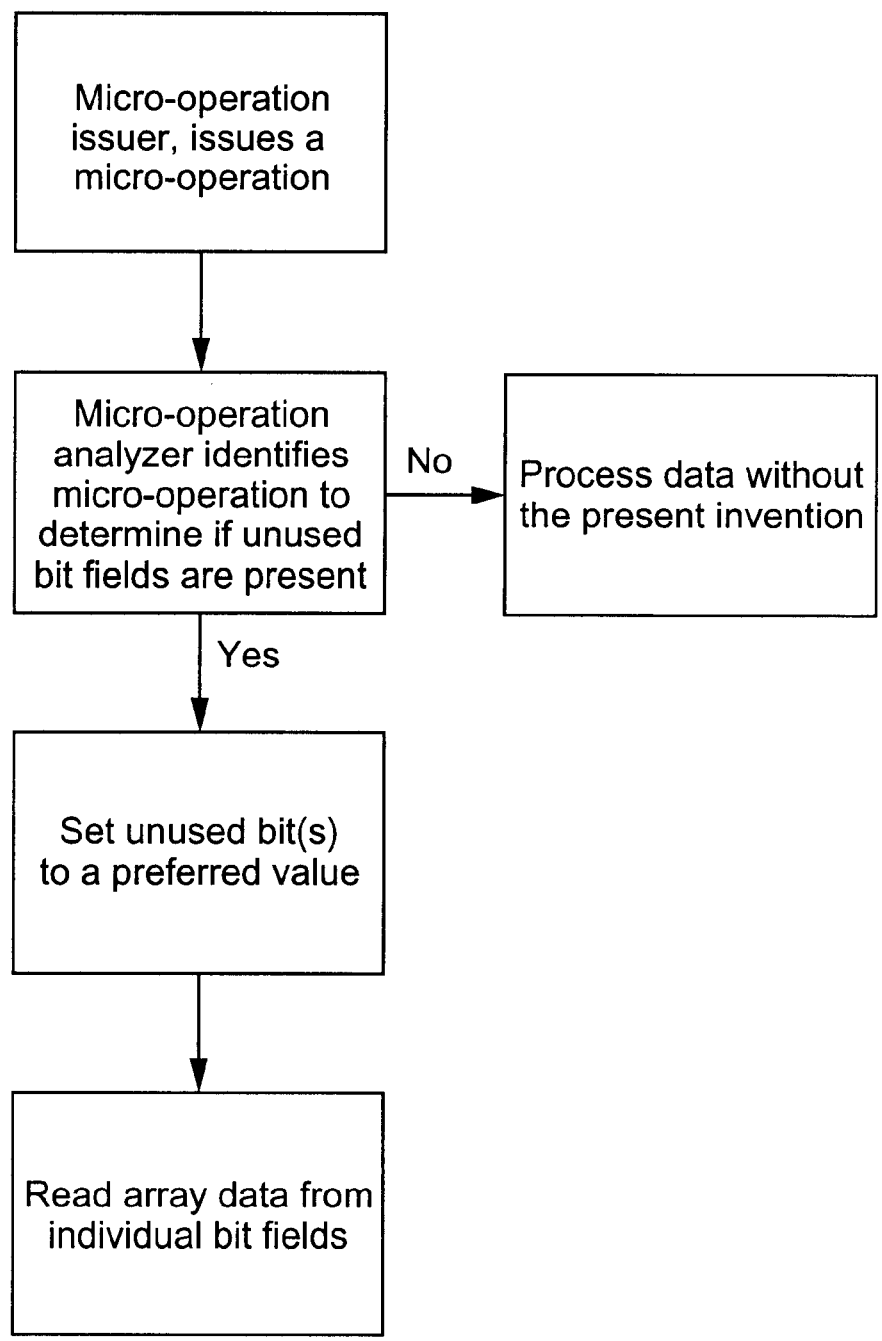
FIG. 4 is a flow chart of an embodiment of the present invention.

In order for circuit 10 to be used to conserve the precharge during bit read operations, unused bit fields must first be identified and the values of those unused bit fields set to the preferred value. In many instances, a micro-operation can be identified as having particular unused bit fields by decoding only two or three bits. Functionally, a micro-operation issuer issues a micro-operation, which is then passed to a micro-operation analyzer to identify the type of micro-operation and the unused bit fields, if any. Next, the unused bit fields are set, or forced, to the preferred value. Finally, the array containing the micro-operation is read. A flow chart of this process is shown as FIG. 4.

An embodiment of the present invention may use bit masks in order to identity the type of micro-operation and force the unused bit fields to a preferred value. Another embodiment uses a look-up table. In yet another embodiment of the present invention, arrays other than micro-operations are identified and unused bit fields are forced to a preferred value.

In an embodiment of the present invention, only certain data arrays or micro-operations are selected because the number of unused bit fields is large relative to the size of the array or because that type of data array is often used. As will be appreciated by those of ordinary skill in the art, various degrees of sophistication may be employed in identifying multiple types of arrays with unused bit fields and mapping the particular bit fields in each. The present invention is not, however, intended to be limited to any particular method of selecting arrays with unused bits.

Those of ordinary skill in the art will also recognize that any particular implementation of the present invention will require careful coordination of the timing between the elements. For example, read bit line 30 must be precharged to a sufficient voltage before clock signal 36 goes high 42 in order to avoid errors in reading the data. However, the coordination of the timing for the present invention is not findamentally different than that required in conventional RAM read circuits. One additional benefit of an embodiment of the present invention is that when read bit line 30 retains the precharge, there is less chance that the subsequent read operation will occur before a sufficient precharge voltage is reached.

Although various embodiments are specifically illustrated and described herein, it will be appreciated that modifications and variations of the present invention are covered by the above teachings and within the purview of the appended claims without departing from the spirit and intended scope of the invention. Moreover, the present invention applies to a broad range of multiple processor architectures, and is therefore a general approach that includes a broad range of specific implementations.

What is claimed is:

1. A method of reducing power consumption while reading an unused data bit, comprising:

identifying the unused data bit in a data array;

setting the data bit to a preferred state value;

precharging a bit read line to read the data bit; and reading the data bit.

2. A method in accordance with claim 1, wherein:

said preferred state is zero.

3. A method in accordance with claim 1, wherein:

said preferred state is one.

4. A method in accordance with claim 1, wherein:

said precharging occurs when a clock signal cycles to zero.

5. A method in accordance with claim 1, wherein:

said reading occurs when a clock signal cycles to one.

6. A method in accordance with claim 1, wherein:

said precharging and said reading are performed within a single clock cycle.

7. A method in accordance with claim 1, wherein:

said data array is a Free List Manager (FLM) array.

8. A method in accordance with claim 1, wherein:

said data array is a Reservation Station (RS) array.

9. A method of preventing discharge while reading random access memory (RAM), comprising:

identifying an unused data bit;

writing a preferred state value to said unused data bit;

reading said unused data bit with a single bit read line.

10. A method in accordance with claim 9, further comprising:

precharging said single bit read line before reading said unused date bit.

11. A method in accordance with claim 10, further comprising:

maintaining a precharge on single bit read line after reading said unused data bit.

12. A random access memory (RAM) reader, for reading data at a RAM location, comprising:

a write bit line for setting a preferred data value at an unused RAM location, said write bit line switchably coupled to both the RAM location and a ground;

a read bit line for reading said preferred data value at an unused RAM location, said read bit line switchably coupled to both the RAM location and a ground;

a precharger for precharging said read bit line and electrically coupled to said read bit line, said precharger responsive to a precharge signal;

a voltage source for supplying said precharges, said voltage source switchably coupled to said precharger;

an output line for outputting said preferred data value responsive to a latch signal, said output line switchably coupled to said read bit line, a voltage source and a ground.

13. A RAM reader in accordance with claim 12, further comprising:

one or more access switches for switchably coupling said write bit line to the RAM location.

14. A RAM reader in accordance with claim 12, wherein:

said precharge signal and said latch signal are opposite in phase to a clock signal.

15. A RAM reader in accordance with claim 12, wherein:

said write bit line includes an inverter for inverting said data value prior to storing said data.

16. A RAM reader in accordance with claim 12, wherein:

said data value is a zero when the RAM location corresponds to an unused data bit.

17. A RAM reader in accordance with claim 16, wherein:

said zero data value prevents said read bit line from discharging to said ground.

18. A RAM reader in accordance with claim 12, wherein:

said data value is a preferred state value when the RAM location corresponds to an unused data bit.

19. A RAM reader in accordance with claim 18, wherein:

said preferred state value prevents said read bit line from discharging to said ground.

20. A RAM reader in accordance with claim 12, wherein:

a plurality of CMOS gates are used as switchable coupling devices.

21. A method of conserving power during memory read operations, comprising:

identifying one or more arrays with one or more unused data bits;

writing a preferred data bit value to said one or more unused data bits in said one or more arrays before the read operations; and reading said one or more unused data bits without discharging a precharge to ground.

22. A method in accordance with claim 21, wherein:

said preferred data bit value is a zero.

23. A method in accordance with claim 21, wherein:

said preferred data bit value is a one.

* * * * *